United States Patent [19]
Brunolli

[11] Patent Number: 5,303,195
[45] Date of Patent: Apr. 12, 1994

[54] TRANSDUCER SYSTEM

[75] Inventor: Michael J. Brunolli, Escondido, Calif.

[73] Assignee: Brooktree Corporation, San Diego, Calif.

[21] Appl. No.: 920,265

[22] Filed: Jul. 27, 1992

Related U.S. Application Data

[60] Continuation of Ser. No. 316,333, Feb. 27, 1989, abandoned, which is a division of Ser. No. 810,911, Dec. 18, 1985, Pat. No. 4,905,189.

[51] Int. Cl.$^5$ .............................................. G11C 7/00
[52] U.S. Cl. ................................ 365/205; 365/189.05; 365/190
[58] Field of Search ............... 365/149, 205, 207, 208, 365/190, 189.05

[56] References Cited

U.S. PATENT DOCUMENTS 4,479,202 10/1984 Uchida ........................... 365/205 X Primary Examiner—Joseph A. Popek
Attorney, Agent, or Firm—Ellsworth R. Roston; Charles H. Schwartz

[57] ABSTRACT

First binary bits are read synchronously relative to clock signals (e.g. 125 MHz) from first memory positions and second binary bits are read from, or written in, second memory positions asynchronously relative to the clock signals without affecting the reading of the first memory bits. For synchronously reading the first bits, a plurality of channels are sequentially activated at a suitable frequency (e.g. 25 megahertz). Information from pairs of data lines are introduced into a pair of buses at the clock frequency. The information in the buses is sampled upon the occurrence of the first polarity in synchronizing signals having frequency (e.g. 62.5 MH$_3$) derived from the clock signals and is prolonged and evaluated in a first pair of output lines upon the occurrence of the second polarity in the synchronizing signals. The information being evaluated is introduced to such output lines during the occurrence of the first polarity in the synchronizing signals. The evaluated signals on such output lines are then neutralized upon the occurrence of the first polarity in such synchronizing signals. Similarly, the information in the buses is sampled upon the occurrence of the second polarity in the synchronizing signals and is prolonged and evaluated in a second pair of output lines upon the occurrence of the first polarity in the synchronizing signals. The evaluated signals on all of the output lines are then processed on an exclusive basis to insure that only one of the evaluated signals can be introduced at any one time to a resultant line.

25 Claims, 4 Drawing Sheets

TRANSDUCER SYSTEM

This is a continuation of application Ser. No. 316,222 filed Feb. 27, 1989, now abandoned, which in turn is a division of application Ser. No. 810,911 filed Dec. 18, 1985, now U.S. Pat. No. 4,905,189.

SUMMARIES OF THE INVENTION

This invention relates to a system for reading information from a random access memory and writing information in such a memory. The invention further relates to a system for providing such reading and/or writing at relatively high frequency of at least one hundred and twenty five (125) megahertz. The invention particularly relates to a system for simultaneously reading binary coded information from a random access memory on a synchronous basis relative to clock signals at a suitable frequency such as approximately one hundred twenty five (125) megacycles and simultaneously reading binary coded information from, or recording binary coded information in, the random access memory on an asynchronous basis relative to the clock signals.

BACKGROUND OF THE INVENTION

Random access memories are provided for storing binary coded information. These memories are versatile because the binary information at different positions in the memory can be read from the memory and because binary coded information can be written in the memory at any desired position to update information previously stored in the memory at such positions. The information read from the memory can be processed by a digital computer or a data processor to obtain certain desired operations such as the movements of a control mechanism and the information written into the memory to update the memory may be obtained from the actual movements of the control mechanism. In this way, any differences between the actual and desired movements of the control mechanism can be corrected.

Random access memories now in use have certain limitations. These result in large part from limitations in the operation of the transducing system associated with the memory for reading information from the memory or writing information in the memory. One of these limitations results from the inability of the transducing system simultaneously to read information from one position in the memory and write information into a second position in the memory. A further limitation results from the limited speed in reading information from the memory or writing information in the memory. This limited speed in turn curtails the speed at which the digital computer or data processing system associated with the memory is able to process information. A third limitation results from the inability of the system to read binary coded information from the memory on a synchronous basis relative to the clock signal and simultaneously read binary coded information from, or record binary coded information in, the memory on an asynchronous basis relative to the clock signals.

A considerable effort has been made over an extended number of years to provide a random access memory system which will overcome the limitations discussed in the previous paragraph. Such effort has been particularly intent in view of the rapid expansion in the uses and perfection of data processing. In spite of such efforts, the capabilities of the random access memory systems still trail the capabilities of the associated data processors and accordingly impose limitations on the operation of these data processors.

SUMMARY OF THE INVENTION

This invention provides a read-write system which is capable of operating with a random access memory to overcome the limitations discussed previously. The system of this invention also provides for the reading of first bits of information from the memory at first positions on a synchronous basis relative to clock signals (e.g. 125 MHz) and the simultaneous reading of second bits of information from, or writing of second bits of information in, the memory at second positions on an asynchronous basis relative to the clock signals without affecting the reading of the first bits of information from the memory.

The system of this invention provides for the sequential activation of a plurality of channels at a reduced frequency, such as twenty five megahertz (25 mhz), in each channel. The system further provides for the introduction to a pair of buses of information from a plurality of pairs of data lines at a frequency corresponding to a clock frequency of one hundred and twenty five megahertz (125 mhz).

The information in the pair of buses is sampled upon the occurrence of a first polarity in synchronizing signals derived from the clock signals and having a frequency of sixty two and one-half megahertz (62.5 mhz) and is evaluated upon the occurrence of a second polarity in the synchronizing signals. The information being evaluated is introduced to a first pair of output lines during the occurrence of the first polarity in the synchronizing signals. The evaluation of the information and prolonged during the the occurrence of the second polarity in the synchronizing signals. The information being evaluated as represented by the signals on the first pair of output lines are is then neutralized upon the next occurrence of the first polarity in such synchronizing signals. Similarly, the information in the pair of buses is sampled upon the occurrence of the second polarity in the synchronizing signals and is evaluated in a second pair or output lines upon the occurrence of the first polarity in the synchronizing signals. The evaluated signals on the first and second pairs of output lines are then processed on an exclusive basis to insure that only one of the evaluated signals can be introduced at any one time to a resultant line.

DETAILED DESCRIPTION OF THE DRAWING

Figure 1:
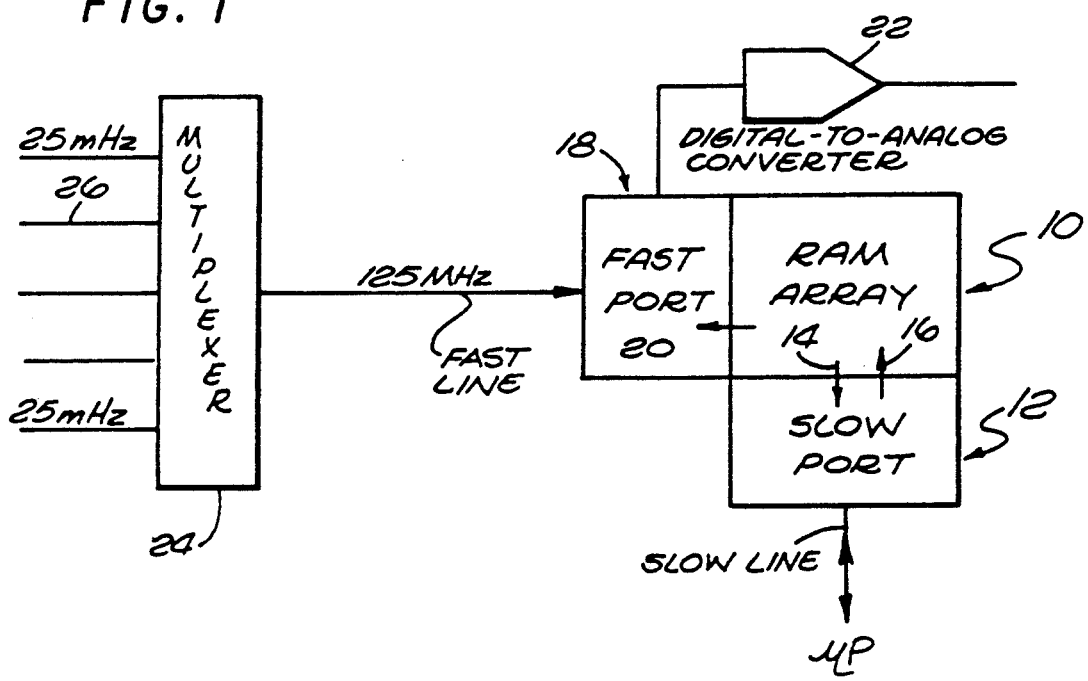
FIG. 1 is a schematic block diagram of a random access memory and of a system for reading first bits of information from first positions in the memory on a synchronous basis relative to clock signals and simultaneously reading second bits of information from, or writing second bits of information in, second positions in the memory on an asynchronous basis relative to the clock signals without having the reading of the first bits of information from the memory affect the reading or writing of the second bits of information.

FIG. 1 illustrates one embodiment of the invention in block form. The embodiment shown in FIG. 1 includes a random access memory generally indicated at 10. The random access memory is adapted to store a plurality of bits of binary coded information in an array in which the position of each binary coded bit n the array is identified by an individual distance along a pair of coordinate axes such as an x-axis and a y-axis. The random access memory is adapted to provide an erasable storage of binary coded information in which the binary coded information at different positions in the memory can be constantly updated. Random access memories are commercially available which can store tens, and even hundreds, of thousands of bits of binary coded information in an array in a relatively small area. The binary coded information may be represented by logic levels of signals in which a first logic level or amplitude represents a binary "1" and a second logic level represents a binary "0".

A slow port generally indicated at 12 is associated with the random access memory 10. The port 12 is adapted to read information from specified positions in the memory 10 or to write binary information in specified positions in the memory. The reading of such binary coded information from the memory 10 is indicated by an arrow 14 and the writing of such information in the memory is indicated by an arrow 16. The reading and writing of such binary coded information may occur on an asynchronous basis relative to clock signals at a suitable frequency such as 125 megahertz.

A fast port generally indicated at 18 is also associated with the memory 10. As indicated by an arrow 201, the fast port 18 is adapted to read information from the memory 10 on a synchronous basis relative to the clock signal at a relatively high frequency such as frequencies of at least 125 megahertz. This frequency is considerably higher than the frequency of the signals in the slow port 12. The signals read in the fast port 18 may be introduced to a digital-to-analog converter 22 which converts the binary signals from the fast port 18 into corresponding analog signals for subsequent processing.

In order to obtain the reading of signals in the fast port 18, the operation of the fast port 18 may be controlled as by a multiplexer 24. The multiplexer 24 produces signals at a reduced frequency, such as approximately twentyfive megahertz (25 mhz), on a plurality (such as 5) of lines 26. The signals in each of the lines 26 are shifted in phase relative to the signals in the other ones of the lines 26. When these signals are combined in the multiplexer 24, the output of the multiplexer is at approximately 125 megacycles.

Figure 2:
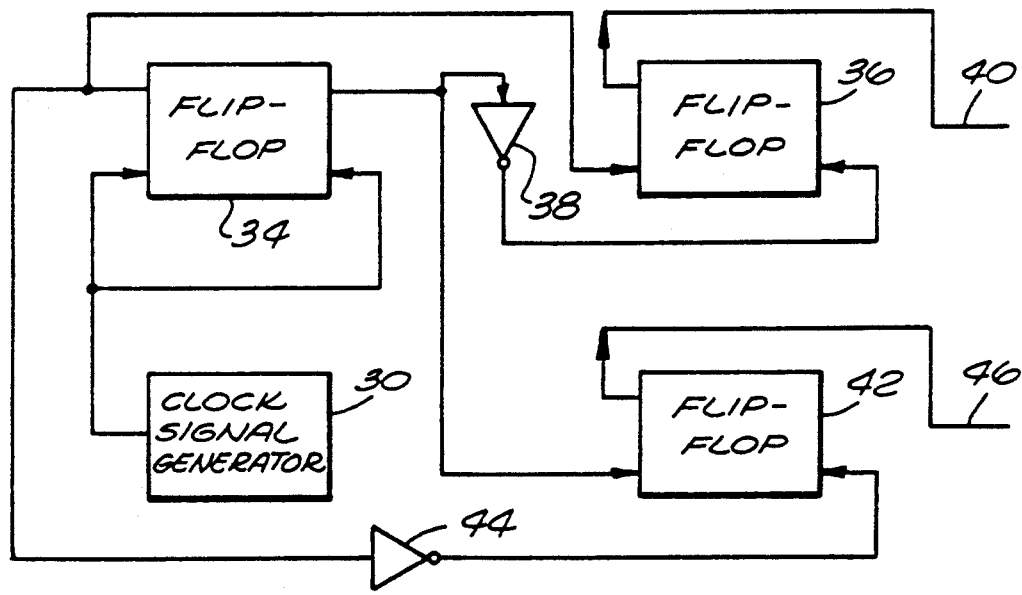
FIG. 2 is a block diagram of a system for producing synchronizing signals for use in the read-write system of FIG. 1.
Figure 3:
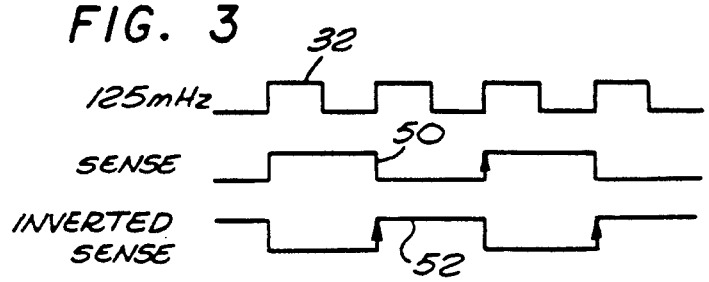
FIG. 3 illustrates waveforms of clock signals which are produced by the system shown in FIG. 2.

FIG. 2 illustrates in block form a system for generating clock signals. The system shown in FIG. 2 includes a clock signal generator 30 which produces signals at a particular frequency such as one hundred and twenty-five megahertz (125 mhz). These signals are illustrated at 32 in FIG. 3. The signals from the clock generator 30 are introduced to true and false input terminals of a flip-flop 34 also having true and false output terminals. The true output terminal of the flip-flop 34 is connected to the true input terminal of a flip- flop 36. The false output signals from the flip-flop 34 are amplified and inverted by an amplifier-inverter 38 and are introduced to the false input terminal of the flip-flop 36. An output line 40 extends from the false output terminal of the flip-flop 36.

Similarly, a connection is made from the false output terminal of the flip-flop 34 to the true input terminal of a flip-flop 42. The false input terminal of the flip-flop 42 receives the signals from an amplifier-inverter 44 corresponding in construction and operation to the amplifier-inverter 38. The operation of the amplifier-inverter 44 is controlled by the signals on the true output terminal of the flip-flop 34. The true output terminal of the flip-flop 42 is connected to an output line 46.

The flip-flop 34 is alternately triggered to the true and false states when the signal 32 changes from a negative polarity to a positive polarity. The flip-flop 34 accordingly produces the signals 32 in FIG. 3. When the flip-flop 34 is triggered to the true state, it triggers the flip-flop 36 to the true state. In the rising amplitude of the next cycle of the clock signals 32, the flip-flop 34 is again triggered to the true state. This causes a negative signal to be produced on the false terminal of the flip-flop 34. This signal is inverted by the amplifier-inverter 38 to trigger the flip-flop 36 to the false state. In this way, synchronizing signals are produced on the output terminal 40 with a frequency one-half ($\frac{1}{2}$) that of the clock signals 32 and with a polarity as indicated at 50 in FIG. 3. The flip-flop 42 also produces synchronizing signals 52 with a frequency one-half ($\frac{1}{2}$) that of the clock signals 32 but with a polarity opposite to the polarity of the signals 50 in FIG. 3. The signals 52 produced by the flip-flop 42 are introduced to the line 46.

Figure 4:
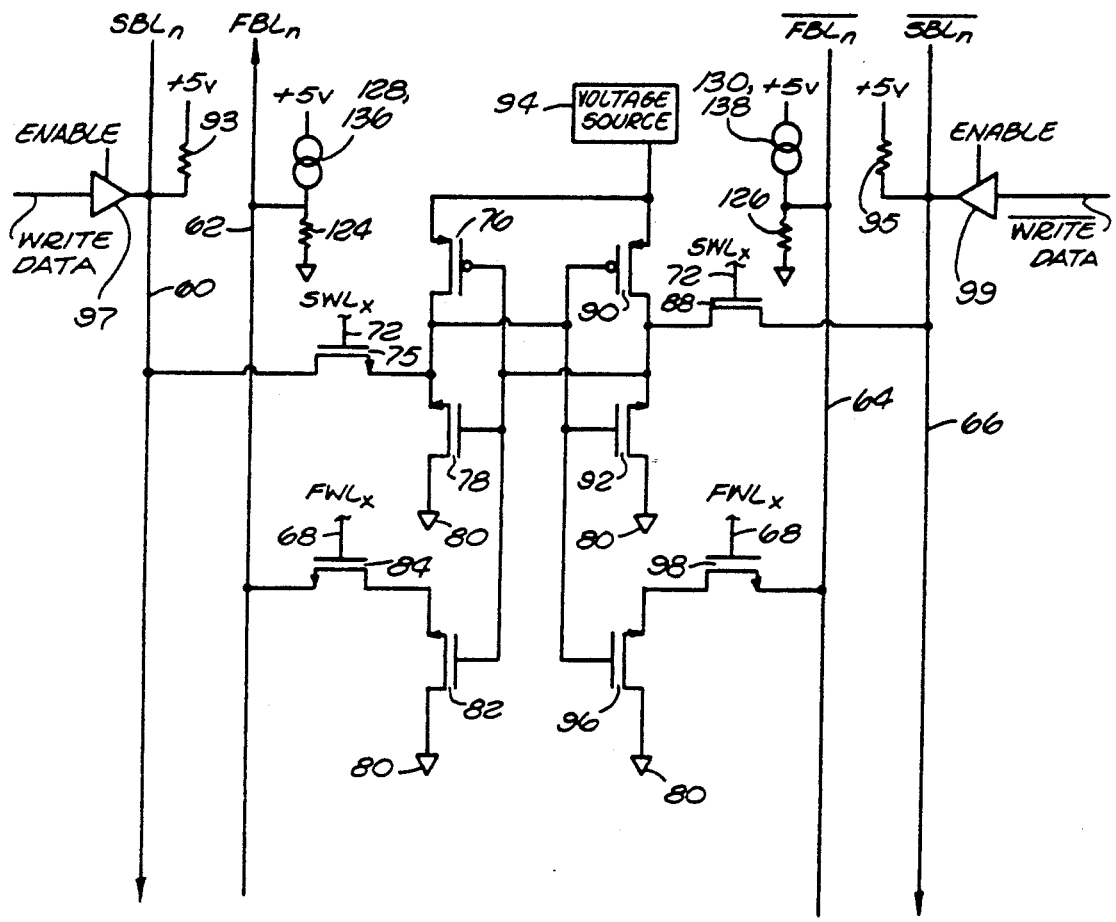
FIG. 4 is a diagram of circuitry which is used in the read-write system shown in FIG. 1 to read first bits of information from a first position in the memory and simultaneously read second bits of information from, or write second bits of information in, second positions in the memory without having the reading of the first bits of information from the memory affect the reading or writing of the second bits of information.

FIG. 4 illustrates circuitry for reading information in the fast port 18 and reading information in, or recording information from, the slow port 12 in FIG. 2. The circuitry shown in FIG. 4 provides for the processing of information in the slow port 12 without any interference from the reading of information in the fast port 18. The circuitry shown in FIG. 4 includes lines 60, 62, 64, 66, 68 and 72. The lines 60 and 66 provide signals respectively coded for logic states of "true" and "false" in a binary bit to be processed in the slow port 12. These signals are respectively indicated as "$SBL_n$" and "$\overline{SBL_n}$". Similarly, the lines 62 and 64 provide signals respectively coded for logic states of "true" and "false"

in a binary bit to be processed in the fast port 18. These signals are respectively indicated as "$FBL_n$" and "$\overline{FBL}_n$".

The line 72 provides signals coding for the "x" word to be processed in the slow port 12. These signals are indicated as "$SWL_x$". In like manner, the line 68 provides signals coding for the "x" word to be processed in the fast port 18. These signals are indicated at "$FWL_x$". In other words, the logic levels of signals in the lines 60 and 66 indicate the value of the $n^{th}$ bit in the x word for the slow port and the lines 62 and 64 indicate the value of the $n^{th}$ bit in the x word for the fast port.

The signals on the line 60 are introduced to the source of an n-transistor 75, the gate of which receives signals from the line 72. The drain of the transistor 75 is connected to the drain of a p-transistor 76 and to the drain of an n-transistor 78, the source of which is connected to a suitable reference potential such as a ground 80. The gates of the transistors 76 and 78 have a common connection with the gate of an n-transistor 82. The source of the transistor 82 may be common with the reference potential such as the ground 80. The drain of the transistor 82 is connected to the source of an n-transistor 84. The gate of the transistor 84 receives signals from the line 68 and the drain of the transistor 84 receives signals from the line 62.

The line 66 is connected to the drain of an n-transistor 88, the gate of which receives signals from the line 72. The source of the transistor 88 has a common connection with the drain of a p-transistor 90 and the drain of an n-transistor 92. The source of the transistor 90 receives an energizing potential such as approximately +5 volts from a suitable voltage source 94, which is also connected to the source of the transistor 76. The gates of the transistors 90 and 92 have a common connection with the drain of the transistor 76, the drain of the transistor 78 and the gate of a transistor 96. The drain of the transistor 90 and the drain of the transistor 92 have a common connection with the gates of the 17 transistors 76 and 78. The source of the transistor 96 is connected to the reference potential such as the ground 80. The drain of the transistor 96 and the source of an n-transistor 98 have a common potential. The gate of the transistor 98 receives the signals on the line 68 and the drain of the transistor 98 receives the signals on the line 64.

Amplifiers 97 and 99 are respectively connected to the lines 60 and 66. The amplifiers are activated by signals on "Enable" lines. When the amplifiers 97 and 99 are enabled, they pass "write" signals through the amplifiers. The "write" signals passing through the amplifiers 97 and 99 respectively represent a binary "true" and a binary "false".

Current sources 136 and 138 are shown in FIG. 4 as being connected to the lines 62 and 64. These current sources correspond to transistors 136 and 138 in FIG. 6. Resistors 124 and 126 are shown in FIG. 4 as being respectively connected from the signal generators 136 and 138 to the reference potential such as ground. The resistors 124 and 126 are respectively shown as transistors 124 and 126 in FIG. 6. Resistances 93 and 95 are also respectively connected between the lines 60 and 66 and the voltage source 94.

The transistor 84 becomes conductive when a signal of high amplitude is produced on the line 68 to indicate the selection of a particular word, such as the "x" word, and a high signal is simultaneously produced on the line 62 (if the transistor 82 is non-conductive) to indicate a binary value of "1" for a particular bit, such as the "n" bit, in the selected word. When the transistor 84 becomes conductive, current flows through a circuit including the line 62, the transistor 84 and 17 the transistor 82 if the transistor 82 is conductive. This current indicates that the particular bit in the selected word has a binary value of "0". A high gate impedance in the transistor 82 isolates the current in the line 62 from the reading and recording of information in the lines 60 and 66.

In like manner, current flows through a circuit including the line 64, the transistor 98 and the transistor 96 when a signal of high amplitude is produced on the line 68 to indicate the selection of a particular word such as the "x" word, and a signal of low amplitude is simultaneously produced (if the transistor 96 is conductive) on the line 64 to indicate a binary value of "1" for the bit, such as the "n" bit, in the $\overline{FBL}$ line in that word. A high gate impedance in the transistor 96 isolates the current in the line 64 from the reading and recording of information in the lines 60 and 66.

The operation of the circuitry shown in FIG. 4 may be seen from several examples. In one example, a binary value of "1" may be read by the fast port 18 in FIG. 1 at the "n" bit of the "x" word. Under such circumstances, the transistors 84 and 98 may become conductive because of the introduction of a high voltage to their gates from the line 68. Because of the interconnections between the gate of each of the transistors 76 and 90 and the source of the other one of such transistors, the transistors 76 and 90 operate as a flip-flop. Thus, only one of the transistors 76 and 90 can be conductive at any one time. As a result, assuming that a high voltage is produced on the drain of the transistor 76, a low voltage is simultaneously produced on the drain of the transistor 90. The low voltage on the drain of the transistor 90 prevents the transistor 82 from being conductive and prevents current from flowing through a circuit including the line 62, the transistor 84 and the transistor 82.

The high voltage on the drain of the transistor 76 is introduced to the gate of the transistor 96 to make the transistor 96 conductive. This causes current to flow through a circuit including the current source 138, the line 64, the transistor 98 and the transistor 96. This current causes the current normally flowing through the resistance 126 from the signal generator 138 to be reduced. However, the current normally flowing through the current source 136 and the resistance 124 continues to be maintained because of the non-conductivity of the transistor 82. This causes the voltage on the line 64 to be reduced relative to the voltage on the line 62. This voltage difference indicates a reading of a binary "1" in the fast port 18.

In the next example, a binary "1" is read from the memory 10 by the slow port 12 at the "n" bit of the "x" word. Under such circumstances, a high voltage is introduced to the gates of the transistors 75 and 88 to provide for these transistors to become conductive. The resultant high voltage on the source of the transistor 75 is introduced to the gate of the transistor 92 to make the transistor 92 conductive. Current accordingly flows through a circuit including the voltage source 94, the resistance 95, the transistor 88 and the transistor 92. The resultant voltage drop across the resistance 95 causes the voltage on the line 66 to be less than the voltage on the line 60. This voltage difference indicates the reading of a binary "1" by the slow port 12.

The transistor 88 has a higher impedance than the transistor 92. This causes a relatively low voltage to be produced on the source of the transistor 92. This voltage is introduced to the gate of the transistor 78 to make the transistor 78 non-conductive. As a result, current cannot flow through a circuit including the line 60, the transistor 75 and the transistor 78. This maintains the voltage on the line 60 higher than the voltage on the line 66 as discussed in the previous paragraph.

In the third example, a binary "1" is written in the memory 10 by the slow port 12 at the "n" bit of the "x" word. Because the "x" word is being activated, the voltage on the transistor 75 is high. At this instant, the amplifiers 97 and 99 are enabled by a signal on the "enabled" line. Upon being enabled, the "write" signal is introduced by the amplifier 97 to the line 60 as a positive voltage. At the same time, a voltage having the reference such as ground is introduced to the line 66 through the amplifier 99. This low voltage is introduced to the drain of the transistor 88. A current is accordingly forced by the amplifier 99 to flow through a circuit including the voltage source 94, the transistor 90, the transistor 88 and the line 66.

The high voltage on the line 60 causes the transistor 75 to become conductive so that a high voltage is produced on the source of the transistor. This voltage is introduced to the gate of the transistor 92 to make the transistor 92 conductive. Current accordingly flows through a circuit including the voltage source 94, the transistor 90 and the transistor 92. Since the transistor 90 has a considerably higher impedance than the transistor 92, this current flow causes the voltage on the source of the transistor 92 to have a potential approaching the reference potential such as ground. This voltage is introduced to the gate of the transistor 78 to maintain the transistor 78 non-conductive and thereby maintain the high potential on the source of the transistor 75.

The arrangement described above is advantageous in that the same bit of information may be simultaneously read by the fast port 18 and the slow port 12. Actually, the fast port 18 may read the binary coded information previously recorded as the value of a particular bit in the memory while the slow port 12 may be writing new binary coded information for that bit in the memory.

Figure 5:
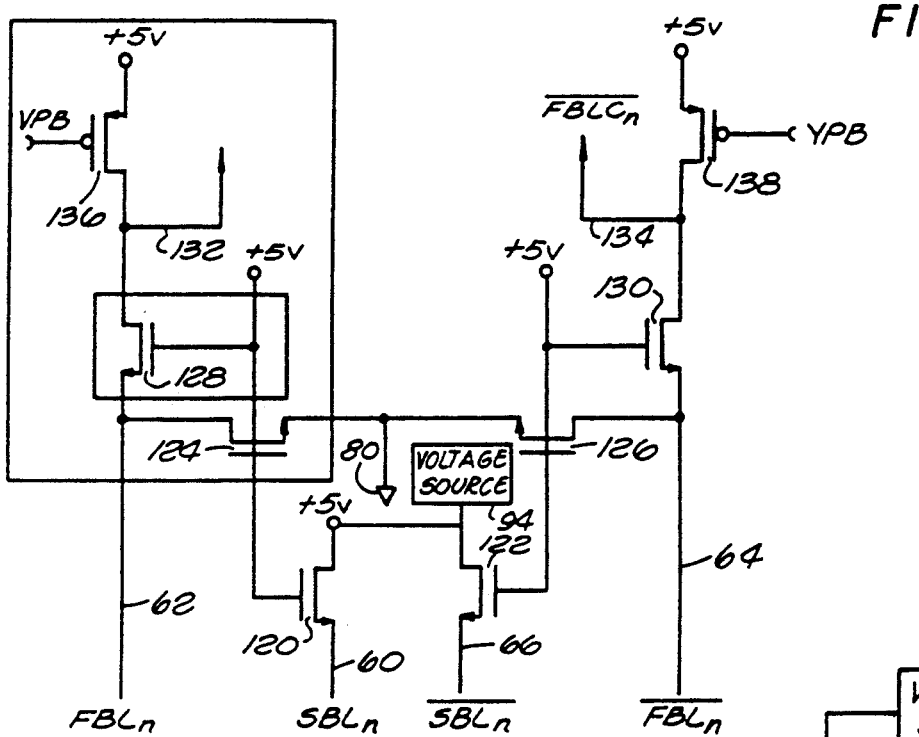
FIG. 5 is a diagram of circuitry for amplifying signals produced by the circuitry shown in FIG. 4 and for providing the amplified signals with optimal characteristics.

FIG. 5 illustrates circuitry for processing the currents flowing in the lines 60, 62, 64 and 66 in FIGS. 4 and 5 so that the signals have a common mode and the deviations of the signals from the common mode represent binary information. The circuitry shown in FIG. 5 includes the lines 60, 62, 64 and 66. The lines 60 and 62 are respectively connected to the sources of n-transistors 120 and 122 having their drains connected to the voltage source 94. Connections are respectively made from the gates of the transistors 120 and 122 to the voltage source 94. The drains of the transistors 124 and 126 are respectively connected to the lines 64 and 66. The sources of the transistors 124 and 126 receive the reference potential such as the ground 80.

The gates of the transistors 120 and 122 are also respectively connected to gates of n-transistors 128 and 130 and are further connected to receive a positive potential from the voltage source 94. The sources of the transistors 128 and 130 respectively receive the signals on the lines 64 and 66. The signals on the drains of the transistors 128 and 130 are respectively applied to intermediate lines 132 and 134 and are also respectively applied to the drains of p-transistors 136 and 138. The sources of the transistors 136 and 138 have a positive potential such as +5 volts applied from the voltage source 94. The gates of the transistors 136 and 138 have a voltage bias (indicated as "VPB") applied to them to bias the transistors to produce a low current.

The transistors 128 and 130 respectively operate as cascode amplifiers. This causes a gain in the order of 1½ to 2 to be produced in each of these cascode amplifiers when a signal is introduced to a particular one of the lines 64 and 66 associated with that amplifier. The signal produced as a result of the operation of the cascode amplifier 128 is introduced to the line 132 and the signal produced as a result of the operation of the cascode amplifier 130 is introduced to the line 134.

The transistors 136 and 138 are biased, by the voltages applied to their gates, to produce a low current in the transistors at all times. The low current in the transistor 136 flows through the cascode amplifier defined by the transistor 128 and through the transistor 124 to the reference potential such as the ground 80. Similarly, the current through the transistor 138 flows through the cascode amplifier defined by the transistor 130 and through the transistor 126 to the reference potential such as the ground 80. The relatively low currents through the transistors 124 and 126 establish a common mode in the lines 64 and 66 to insure that noise in the lines is reduced. In this way, the voltage swings in these lines from the common mode represents binary information.

Figure 6:
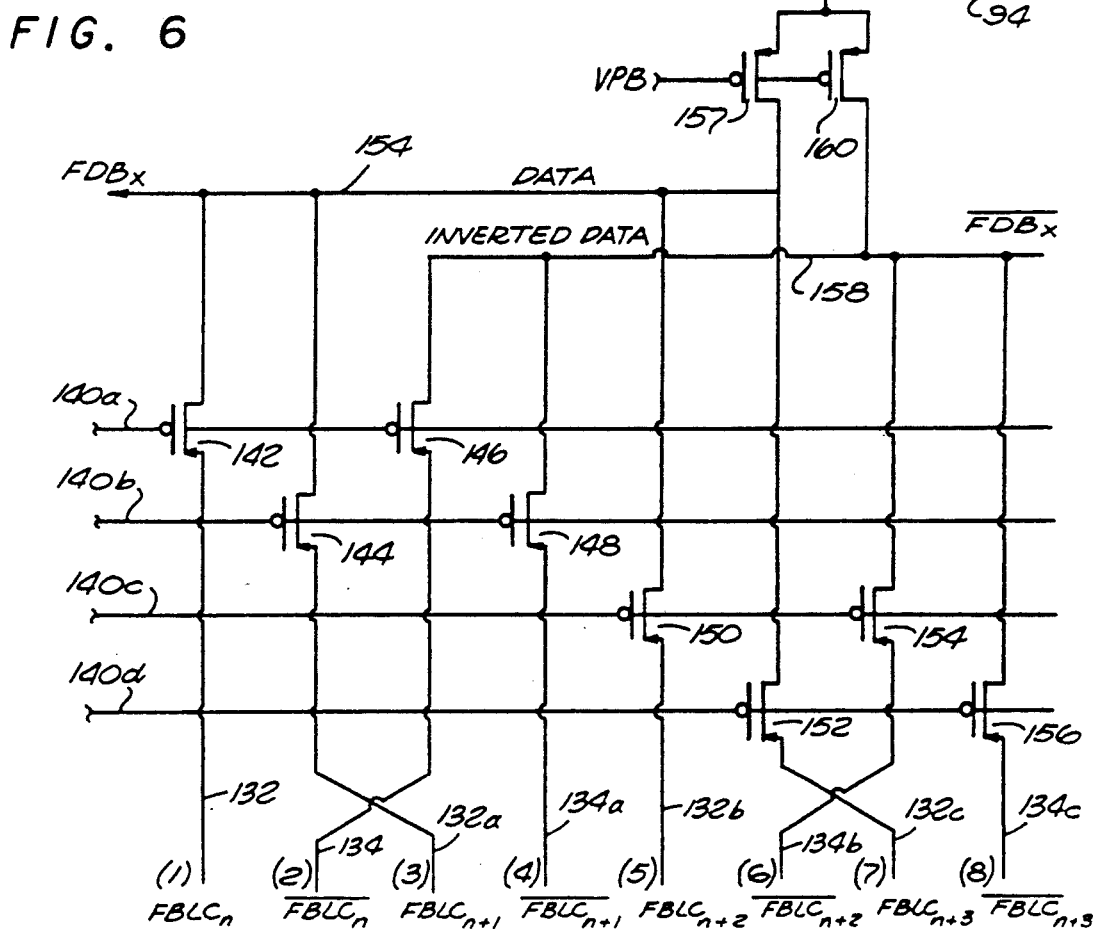
FIG. 6 is a schematic diagram of circuitry for randomly activating a plurality of channels and for introducing to a pair of buses, in accordance with the activation of the different channels, the amplified signals produced by circuitry as shown in FIG. 5.
Figure 7:
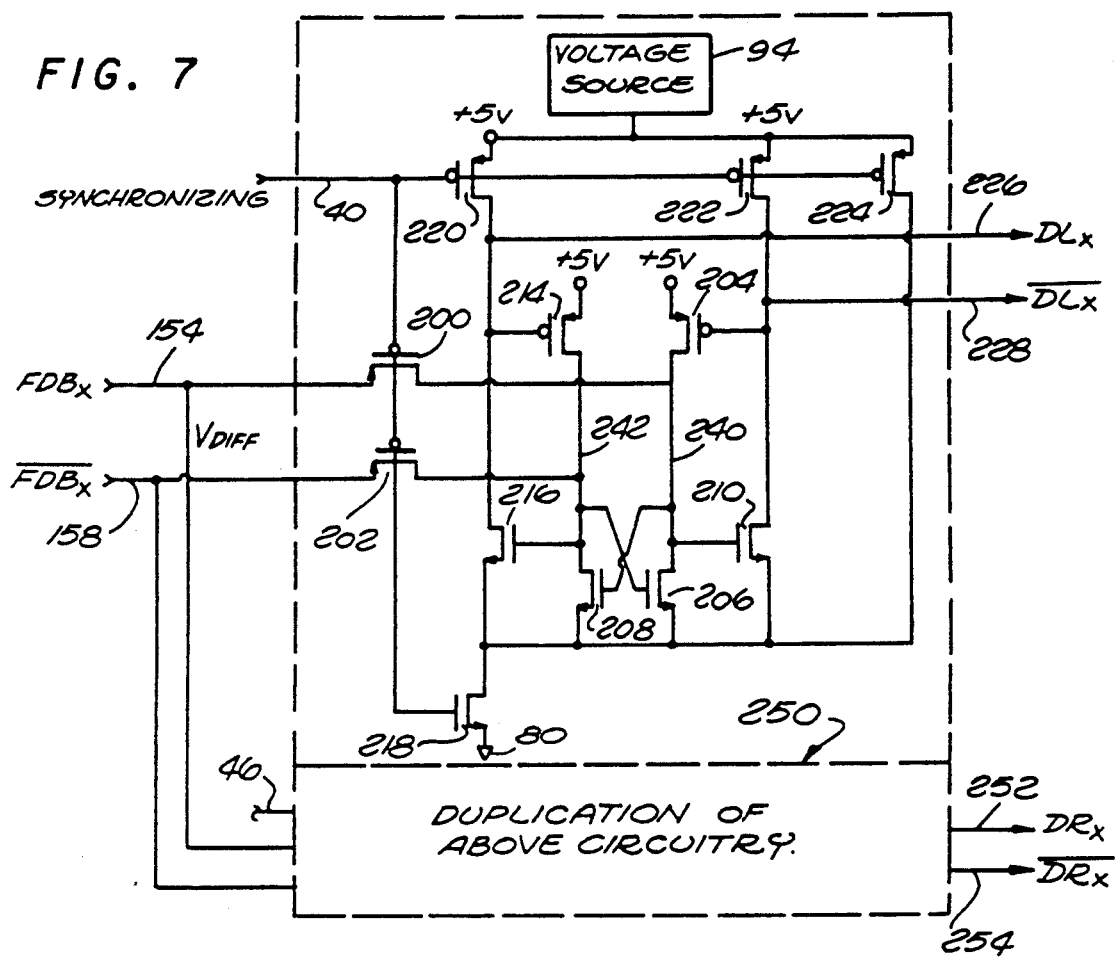
FIG. 7 is a schematic diagram of circuitry for sampling signals from the buses of FIG. 6 during the occurrence of a first polarity in the synchronizing signals and for evaluating the sampled signals upon the occurrence of a second polarity in the synchronizing signals and for introducing the evaluated signals to pairs of output lines.

The intermediate lines 132 and 134 are also shown in FIG. 6. These lines are designated in FIG. 6 as "FBLC$_n$," and "$\overline{FBLC}_n$. Other corresponding pairs of lines are indicated in FIG. 7 at 132a and 134a, (respectively designated as "FBLC$_{n+1}$" and "$\overline{FBLC}_{n+1}$"), 132b and 134b (respectively designated as "FBLC$_{n+2}$" and $\overline{FBLC}_{n+2}$") and 132c and 134c, (respectively designated as "FBLC$_{n+3}$" and "$\overline{FBLC}_{n+3}$"). A plurality of channels are also indicated in FIG. 6 at 140a, 140b, 140c and 140d. The channels 140a, 140b, 140c and 140d operate as the equivalent of an x-y matrix with the lines 132 and 134, 132a and 134a, etc., to select a particular bit in the memory 10.

The lines 132, 134, 132a, 134a, 132b, 134b, 132c, and 134c respectively have common connections with the drains of p-transistors 142–156 (even numbers only). The signals in the channel 140a are introduced to the gates of the transistors 142 and 146; the signals in the channel 140b are introduced to the gates of the transistors 144 and 148; the signals in the channel 140c are introduced to the gates of the transistors 150 and 154; and the signals in the channel 140d are introduced to the gates of the transistors 152 and 156.

The sources of the transistors 142, 144, 150 and 152 have a common connection with a bus 154 and with the drain of a p-transistor 157. Similarly, the sources of the transistors 146, 148, 154 and 156 have a common connection with a bus 158 and with the drain of a p-transistor 160. The gates of the transistors 157 and 160 are biased to produce a current of relatively low amplitude through the transistors. A voltage is applied to the sources of the transistors from the voltage source 94.

The circuitry of FIG. 6 constitutes a switching matrix. For example, when the amplitude of the signal on the line 132 is high and the channel 140a is energized, current flows through the bus 154 and the transistor 142. Similarly, when a signal is produced in the line 134a to represent a binary "0" and the channel 140b is activated, current flows through the bus 158 and transistor 148.

The transistors 157 and 160 operate in a common mode similar to the operation of the transistors 124 and 126 in FIG. 5. As a result of their common mode operation, the transistors 157 and 160 insure that any variations in the voltages on the lines 154 and 158 represent binary coded information. As will be appreciated, the signals produced in the lines 154 and 158 represent signals read from the memory 10 by the fast port 10. The signals on the buses 154 and 158 are respectively represented as and "FDB$_x$" and "$\overline{FDB}_x$".

The buses 154 and 158 of FIG. 6 are also shown in FIG. 7. The synchronizing signal lines 40 and 46 of FIG. 2 are also shown in FIG. 7. The signals on the lines 154 and 158 are respectively introduced to the drains of p-transistors 200 and 202 and the signals on the clock line 40 are introduced to the gates of these transistors. The source of the transistor 200 has common connections with the drain of a p-transistor 204, the source of an n-transistor 206, the gate of an n-transistor 208 and the gate of an n-transistor 210. Similarly, connections are made from the source of the transistor 202 to the drain of a p-transistor 214, the drain of the transistor 208, the gate of the transistor 206 and the gate of an n-transistor 216.

The sources of the transistors 204 and 214 receive a positive potential from the voltage source 94. The drains of the transistors 206, 208, 210 and 216 have a common connection with the source of an n-transistor 218. The drain of the transistor 218 is common with the reference potential such as the ground 80. The gate of the transistor 218 receives the signals on the synchronizing line 40.

The synchronizing line 40 is also connected to the gates of p-transistors 220, 222 and 224. The sources of the transistors 220, 222 and 224 receive a positive potential from the voltage source 94. The drain of the transistor 220 has common connections with the gate of the transistor 214 and the source of the transistor 216 and with an output line 226. The output line 226 is designated as "DL$_x$". connections are made from the drain of the transistor 222 to the gate of the transistor 204, the source of the transistor 210 and an output line 228. The output line 228 is designated as "L/$_x$". The drain of the transistor 224 has a common connection with the drain of the transistor 218.

When the amplitude of the clock signal on the line 40 is low, the transistor 200 becomes conductive. A signal of high amplitude is accordingly introduced to a line 240 common to the drain of the transistor 204 and the source of the transistor 206. This signal has a higher amplitude than the signal on a line 242 common to the drain of the transistor 214 and the source of the transistor 208. The reason is that the transistor 202 remains non-conductive because of a low voltage on the line 158.

Upon the occurrence of a positive polarity in the clock signal 50 on the line 40, the transistor 218 becomes conductive because of the introduction of the synchronizing signal to the gate of the transistor. This causes the voltage on the source of the transistor 218 to decrease to substantially the reference potential such as the ground 80. Because of the high potential on the line 240, the transistor 208 becomes conductive and produces on its source a potential approaching the reference potential such as the ground 80. This voltage is introduced to the gate of the transistor 206 to insure that the transistor 206 will remain non-conductive.

When the voltage on the source of the transistor 218 approaches the reference potential such as the ground 80, the transistor 210 becomes conductive because of the introduction of the high voltage to its gate from the line 240. This causes the voltage on the bus 228 to approach the reference potential such as ground. The resultant reference potential, such as the ground 80, on the gate of the transistor 204 causes the transistor 204 to become conductive. This prolongs a voltage of high amplitude on the line 240 and insures that the transistors 208 and 210 will be strongly conductive.

In the next half cycle (the negative half cycle) of the synchronizing (or clock) signal 50 on the line 40, the transistors 220, 220 and 222 become conductive. When the transistors 222 and 224 become conductive, they introduce the same voltages (the voltage from the voltage source 94) to the lines 226 and 228 to assure that any difference in the potentials on these lines in the previous half cycle of the synchronizing signal is eliminated. This insures that a considerable difference in potential will be produced in the lines 226 and 228 in the subsequent half cycle (the positive half cycle) of the synchronizing signals on the line 40. When the transistor 224 becomes conductive in the negative half cycle of the synchronizing signal 50 on the line 40, it provides a positive voltage to the source of the transistor 218 to insure that the transistor will become conductive in the subsequent half cycle (the positive half cycle) of the clock signals.

When a positive signal is produced on the line 158 to indicate a binary value of "0", the signal on the line 242 has a higher amplitude than the signal on the line 240 during the negative half cycle of the synchronizing signal 50 on the line 40. As a result, when the transistor 218 becomes conductive in the next half cycle (the positive half cycle) of the synchronizing signal 50, the transistors 206 and 210 become conductive and the voltage on the line 226 approaches the reference potential such as the ground 80.

The circuitry shown in detail in FIG. 7 and described above is duplicated in second stages which are included within a box generally indicated at 250 and shown in the broken lines in FIG. 7. However, the stages 250 receive the synchronizing signals 52 on the clock line 46. Since these signals are displaced by 180° in phase from the synchronizing signals 50 on the line 46, the signals produced on output lines 252 and 254 are displaced in phase by 180° from the signals produced on the lines 226 and 228. The signals on the output lines 252 and 254 are respectively indicated as "DR" and "$\overline{DR}_x$" in FIG. 7. In other words, the signals produced in the lines 154 and 158 in one half cycle of the synchronizing signals 46 in FIG. 1 in the stage 250 are sampled while the signals produced on the lines 154 and 158 in the previous half cycles of the synchronizing signals 46 are evaluated in the output lines 226 and 228. In the next half of the synchronizing signals 46, the signals sampled in the stage 250 are evaluated in the output lines 226 and 228 while the stage shown in detail in FIG. 7 is sampling the signals on the lines 226 and 228.

Figure 8:
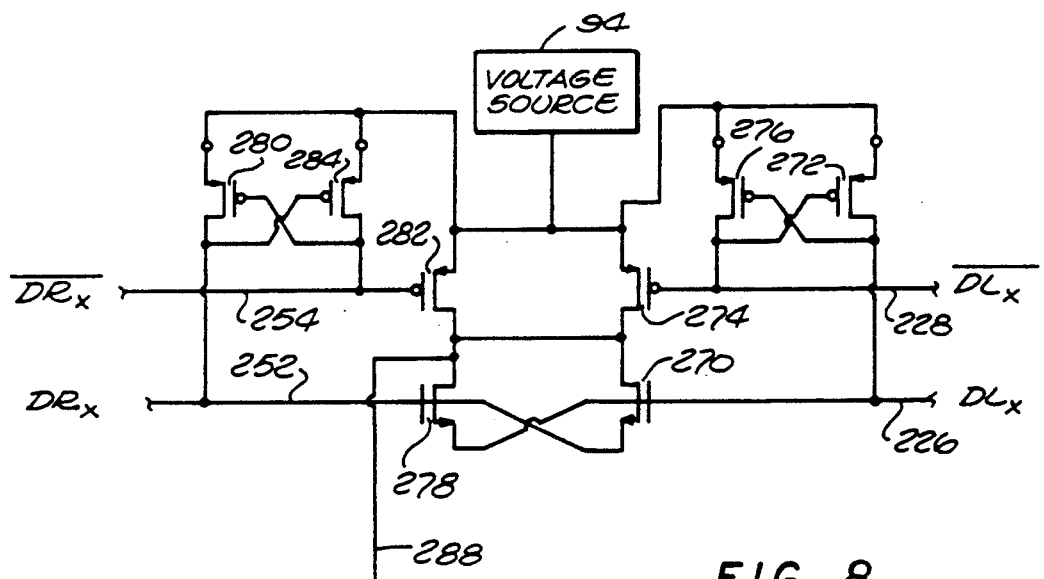
FIG. 8 is a schematic diagram of circuitry for processing the signals produced on the output lines in FIG. 7 to introduce the signals from only one of the output lines to a resultant line at each instant.

The circuitry shown in FIG. 8 includes the lines 226 and 228 and the lines 252 and 254. The lines 226, 228, 252 and 254 are respectively connected to the gates of transistors 270 and 272, the gates of transistors 274 and 276, the gates of transistors 278 and 280 and the gates of transistors 282 and 284. The transistors 270 and 278 are n-transistors and the transistors 274, 276, 280, 282 and 284 are p-transistors. Connections are also respectively made from the lines 226, 228, 252 and 254 to the drain of the transistor 272 and the drain of the transistor 278.

The sources of the transistors 272, 274, 276, 280, 282 and 284 receive a positive potential such as +5 volts from the voltage source 94. The drains of the transistors 274 and 282 are respectively common with the source of the transistors 270 and 278. A resultant line 288 extends from a common connection between the drains of the transistors 274 and 282 and the sources of the train 270 and 278.

A signal of low amplitude is produced on only one of the lines 226, 228, 252 and 254 at any time to represent binary coded information and signals of relatively high amplitude are simultaneously produced on the other ones of the output lines 226, 228, 252 and 254. By way of illustration, a signal of low amplitude may be produced on the line 226 and a signal of high amplitude may be simultaneously produced on the lines 228, 252 and 254. When the amplitude of the signal on the line 226 is low, it introduces a low voltage to the drain of the transistor 278. At the same time, a signal of high voltage is introduced to the gate of the transistor 278 from the line 252. This causes the transistor 278 to become conductive so that the voltage on the drain of the transistor approximates the voltage on the drain of the transistor and a signal of low amplitude is produced on the resultant line 288. The low voltage on the source of the transistor 278 also appears on the drain of the transistors 274 282 and the source of the transistor 270 and prevents these transistors from becoming conductive.

To insure the operation of the transistors 270, 274, 278 and 282 as discussed above, the signals on the lines 226 and 228 are introduced to the transistors 272 and 276. These signals prevent the transistor 272 from becoming conductive and cause the transistor 276 to become conductive. This causes a 25, high voltage to be produced on the drain of the transistor 276 and to be introduced to the gate of the transistor 274 to prevent the transistor 274 from becoming conductive.

It may sometimes happen that a signal of low amplitude is produced on the line 228. At the same time, signals of high amplitude are produced on the lines 226, 252 and 254. The signal of low amplitude on the line 228 is introduced to the gate of the transistor 274 to make the transistor conductive. This causes the drain of the transistor 274 to have a high voltage, this voltage being introduced to the resultant line 288. At the same time, the transistors 270 and 278 are not conductive. The reason is that each of these transistors has the same voltage on its gate and its drain because of the high voltages on the lines 226 and 252. The transistor 282 is not conductive because a high voltage is introduced to its gate from the line 254.

The transistors 272 and 276 operate to insure that the transistors 270, 274, 278 and 282 will operate as discussed in the previous paragraphs when the line 228 has a signal of low amplitude and the lines 226, 252 and 254 have signals of high, amplitude. These signals prevent the transistor 276 from becoming conductive and cause the transistor 272 to become conductive. The resultant high voltage on the drain of the transistor 272 insures that the transistor 270 will remain non-conductive.

As will be seen, the circuit shown in FIG. 8 is symmetrical in that the lines 226 and 252 have the same connections and the lines 228 and 254 have the same connections. As a result, the discussion above with respect to the introduction of a signal of low amplitude on the line 226 is applicable to the introduction of a signal of low amplitude on the line 252. Similarly, the discussion above with respect to the introduction of a signal on the line 228 is also applicable to the introduction of a signal on the line 254.

The invention described above has certain important advantages. It provides for the reading of binary coded information from the memory 10 by the fast port 18 at the same time that binary coded information is read from, or written into, the memory 10 by the slow port 12. The simultaneous transducing action is obtained by the fast port 18 and the slow port 12 without obtaining any interference between the actions of the fast and slow ports. This results from the operation of the circuitry shown in FIG. 4 and described above. Actually, both the fast port 18 and the slow port 12 may simultaneously read the same bit of information from the memory.

The invention described above also has other important advantages. It provides for the reading of binary coded information by the fast port 18 on a synchronous basis with signals from the clock signal generator 30 but provides for the reading or writing of binary coded information by the slow port 12 on an asynchronous basis relative to the clock signals. This synchronous-asynchronous relationship between the operation of the fast port 18 and the slow port 12 is especially significant because the reading of binary coded information from the fast port 18 occurs at a high frequency such as approximately one hundred and twenty five megahertz (125 mhz).

The operation of the fast port 18 also offers other important advantages in addition to those specified above. For example, the fast port 18 reads binary coded information from the random access memory 10 in each half cycle of the synchronizing signals 50 and 52 shown in FIG. 3. The fast port 18 samples, in a first stage, first bits of such binary coded information in the negative half cycles of the synchronizing signals 50 and evaluates the sampled information in the positive half cycles of the such synchronizing signals. The fast port 18 samples, in a second stage identical in construction to the first stage, second bits of such binary coded information in the positive half cycles of the signals 52 and evaluates such sampled information in the negative half cycles of such synchronizing signals.

In this way, the frequency of the fast port 18 in reading binary coded information from the memory 10 is effectively doubled without any loss in the ability to read such information. The stages (FIG. 7) sampling and evaluating the binary coded information read by the fast port 18 from the memory 10 also operate advantageously in prolonging the evaluation of the sampled signals in the next half cycles after each such sampling. The circuitry shown in FIG. 8 then introduces such evaluated signals to the resultant line 288 on an exclusive basis whereby the signal from only one of the output lines 226, 228, 252, and 254 can be introduced to the resultant line at each instant.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination,
a plurality of first lines, a resultant line for passing an output signal, first means for providing a plurality of input signals each having first and second characteristics, second means for introducing each individual one of the input signals to an associated one of the first lines, a plurality of first transistors each connected to an associated one of the first lines to become conductive upon the occurrence of the first characteristics in the associated one of the input signals introduced to such line, and third means including a second plurality of transistors each operatively coupled to an individual one of the first transistors and an individual pair of the first lines for providing for the passage of the output signal to the resultant line through the particular one of the first transistors conductive in accordance with the occurrence of the first characteristics in the associated one of the input signals and for preventing any output signal from passing through the other ones of the first transistors to the resultant line.

2. In a combination as set forth in claim 1, a voltage source, and the third means including the second transistors introducing the voltage from the source to individual ones of the first transistors, in accordance with the characteristics of the input signals on such individual pairs of the first lines, to pass the output signal only to the resultant line through the particular one of the first transistors conductive in accordance with the occurrence of the first characteristics in the input signals introduced to the line associated with such particular one of the first transistors, each of the first transistors operatively coupled to an individual one of the second transistors being operatively coupled to one of the lines in the pair operatively coupled to such individual one of the second transistors.

3. In a combination as set forth in claim 1, a first individual pair of the first lines being operatively coupled to a first one of the second transistors in a first relationship and to a second one of the second transistors in a second relationship opposite to the first relationship and a second individual pair of the first lines being operatively coupled to a third one of the second transistors in the first relationship and to a fourth one of the second transistors in the second relationship, a voltage source, and each of the second transistors being operatively coupled in a particular relationship to an individual one of the pairs of the first lines and each of the second transistors being connected to the voltage source for preventing the first transistors other than the particular one of the first transistors from passing the output signal to the resultant line.

4. In a combination as set forth in claim 1, the third means being operatively coupled to the first transistors for introducing a voltage to the first transistors other than the particular transistor to prevent the first transistors other than the particular transistor from being conductive.

5. In a combination as set forth in claim 4, the first and third lines being paired and the second and fourth lines being paired, the fifth means including first, second, third and fourth additional transistors each having a gate, a drain and a source, a power supply connected to the sources of the additional transistors, the gate and drain of the first, second, third and fourth additional transistors being respectively connected to the first and third lines, the third and first lines, the second and fourth lines and the fourth and second lines for producing voltages for preventing current from flowing to the resultant line from the first, second, third and fourth transistors other than the particular one of such transistors.

6. In a combination as set forth in claim 5, the first, second, third and fourth additional transistors constituting p- transistors.

7. In a combination as set forth in claim 1, means for providing a voltage, individual ones of the first, second, third and fourth lines being paired, and the fifth means including a plurality of additional transistors connected to the voltage means and individual pairs of the first, second, third and fourth lines for preventing the first, second, third and fourth transistors other than the particular one of such transistors from being conductive.

8. In combination, a plurality of first lines, a resultant line, means for providing a plurality of input signals each having first and second logic levels, means for introducing individual ones of the input signals to associated ones of the first lines, a first plurality of switching means each connected to at least an individual one of the first lines and to the resultant lien to become conductive and to produce a current in the resultant line when the signals introduced to such switching means have particular logic levels, and a second plurality of switching means each connected to a particular pair of the first lines and to a particular one of the first switching means to assure that current will pass to the resultant line from the conductive one of the first switching means and that current will not flow to the resultant line from any other of the first switching means, the particular one of the first switching means connected to each individual one of the second switching means also being connected to one of the pair of the lines connected to such individual one of the second switching means.

9. In a combination as set forth in claim 8, a voltage source connected to the second plurality of switching means, each of the second switching means being operative to introduce the voltage from the voltage source to the particular one of the first switching means connected to such second switching means to prevent the particular one of the first switching means from producing a current in the resultant line when the conductive one of the first switching means is introducing a current to the resultant line.

10. In a combination as set forth in claim 9, individual ones of the first switching means constituting n-transistors and other ones of the first switching means constituting p-transistors and the second switching means constituting p-transistors.

11. In a combination as set forth in claim 8,
the first switching means constituting transistors, and
the second switching means constituting transistors.

12. In combination,
a plurality of transistors,
a resultant line,
first, second, third and fourth lines each connected to receive an individual one of input signals in a plurality and each having first and second logic levels,
first and second transistors in the plurality being of the n-type and third and fourth transistors in the plurality being of the p-type,
first means for introducing the input signals on the first line to the source of the first transistor and to the gate of the second transistor,
second means for introducing the input signals on the second line to the source of the second transistor and to the gate of the first transistor,
each of the first and second transistors having a conductivity dependent upon the relative characteristics of the input signals respectively introduced to the source and gate of such transistor,
third means for introducing the input signals on the third line to the gate of the third transistor to obtain a conductivity of the third transistor in accordance with the characteristics of the input signals introduced to the gate of the third transistor,
fourth means for introducing the input signals on the fourth line to the gate of th fourth transistor to obtain a conductivity of the fourth transistor in accordance with the characteristics of the input signals introduced to the gate of the fourth transistor,
a resultant line connected to the drains of the first, second, third and fourth transistors, and
fifth means operatively coupled to the first, second, third and fourth transistors for preventing current from flowing to the resultant line through the transistors other than a particular one of the transistors which is conductive in accordance with the characteristics of the input signal introduced to such particular transistor.

13. In combination,
first, second, third and fourth lines each connected to receive an individual one of input signals in a plurality where each of the input signals has first and second logic levels and where only an individual one of the input signals has the second logic level at any one time,
a resultant line,
first, second, third and fourth transistors each having first, second and third terminals and each having the first terminal connected to the resultant line,
means for introducing a first one of the input signals to the second terminal of the second transistor and the third terminal of the third transistor,
means for introducing a second one of the input signals to the second terminal of the third transistor and the third terminal of the second transistor,
means for introducing a third one of the input signals to the second terminal of the first transistor, and
means for introducing a fourth one of the input signals to the second terminal of the fourth transistor, and
means associated with the transistors and the input lines for operating in conjunction with the transistors to assure that only the particular one of the transistors receiving the input signal with the second logic level at any time passes an output signal to the resultant line at that time.

14. In a combination as set forth in claim 13,
means for introducing an energizing voltage to the third electrodes of the first and fourth transistors.

15. In a combination as set forth in claim 14,
the second and third transistors being of the n-type and the first and fourth transistors being of the p-type.

16. In a combination as set forth in claim 13,
the second and third transistors being of a first type and the first and fourth transistors being of a second type different from the first type.

17. In combination,
means for providing first, second, third and fourth signals each having first and second logic levels such that only an individual one of the first, second, third and fourth signals has the second logic level at any one time,
first, second, third and fourth input lines for respectively receiving the first, second, third and fourth input signals,
first, second, third and fourth transistors each having conductive and non-conductive states,
means for interconnecting the second and third transistors in a cross coupled relationship to respectively receive the second and third input signals and to provide for the conductivity of only one of these transistors when an individual one of the second and third input signals has the second logic level,
means for respectively connecting the first and second transistors to receive the first and fourth input signals and to provide a conductivity of individual ones of these transistors in accordance with the second logic level of the input signals on these lines,
a resultant line connected to the first, second, third and fourth transistors to provide a current through the resultant line in accordance with the conductivity of the individual one of the first, second, third and fourth transistors, and
means operatively coupled to the first, second, third and fourth transistors and to the first, second, third and fourth lines for operating upon the transistors in accordance with the logic levels of the signals on the lines to present the other transistors than an individual one of the transistors from passing a current to the resultant line at any time.

18. In combination as set forth in claim 17,
an individual pair of the second and third transistors and the first and fourth transistors constituting a first type and the other pair of the second and third transistors and the first and fourth transistors constituting a second type different from one first type.

19. In a combination as set forth in claim 17,
means for introducing an energizing voltage to the first and fourth transistors,
the first and fourth transistors being of the p-type and the second and third transistors being of the n-type.

20. In a combination as set forth in claim 17,
the last mentioned means including first and second pairs of cross-coupled transistors, the first pair receiving the first and second input signals and the second pair receiving the third and fourth input signals and each of the transistors in the first and second pairs being connected to an individual one of the first, second, third and fourth transistors.

21. In combination, first and second transistors in a first branch, third and fourth transistors in a second branch, the first branch corresponding to the second branch, means for respectively introducing first and second input signals to the first and third transistors, means for introducing third and fourth input signals to the second and fourth transistors, each of the first, second, third and fourth input signals having first and second logic levels and only an individual one of the signals having the second logic level at any one time, a resultant line connected to the transistors to pass a current to the resultant line from the transistors, and means responsive to the first, second, third and fourth input signals and associated with the first, second, third and fourth transistors for insuring that only one of the transistors will pass a current to the resultant line at any time in accordance with the second logic level in an individual one of the input signals at that time and for preventing the other ones of the transistors from passing a current to the resultant line at that time.

22. In a combination as set forth in claim 21, one of the transistors in each branch being of the p-type and the other transistor in each branch being of the n-type.

23. In a combination as set forth in claim 22, the first and third transistors being in parallel and the second and fourth transistors being cross connected.

24. In a combination as set forth in claim 21, the second and fourth transistors being cross coupled.

25. In a combination as set forth in claim 24, means for introducing an energizing voltage to the first and third transistors respectively in the first and second branches.

* * * * *